(12) United States Patent
Shao

(10) Patent No.: US 10,411,595 B2
(45) Date of Patent: Sep. 10, 2019

(54) RIPPLE GENERATION DEVICE AND METHOD FOR A CONSTANT ON-TIME VOLTAGE REGULATOR

(71) Applicant: NXP USA, INC., Austin, TX (US)

(72) Inventor: Bin Shao, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/851,619

(22) Filed: Dec. 21, 2017

(65) Prior Publication Data

US 2019/0199209 A1   Jun. 27, 2019

(51) Int. Cl.

| H02M 3/158 | (2006.01) |
| H02M 3/157 | (2006.01) |
| H02M 1/15 | (2006.01) |
| H02M 3/156 | (2006.01) |
| H03K 4/50 | (2006.01) |
| H02M 1/00 | (2006.01) |

(52) U.S. Cl.
CPC ............ *H02M 3/157* (2013.01); *H02M 1/15* (2013.01); *H02M 3/158* (2013.01); *H02M 3/1563* (2013.01); *H03K 4/50* (2013.01); *H02M 2001/0012* (2013.01); *H02M 2001/0025* (2013.01)

(58) Field of Classification Search
None
See application file for complete search history.

(56) References Cited

U.S. PATENT DOCUMENTS

| 7,019,504 | B2 | 3/2006 | Pullen et al. | |
| 7,482,791 | B2 | 1/2009 | Stoichita et al. | |
| 9,343,962 | B2 | 5/2016 | Cheng et al. | |
| 9,653,992 | B2 | 5/2017 | Yuan et al. | |
| 2002/0125872 | A1* | 9/2002 | Groom | H02M 3/156 323/288 |
| 2008/0088284 | A1* | 4/2008 | Weng | H02M 3/1563 323/271 |
| 2011/0148481 | A1 | 6/2011 | Chung | |
| 2012/0299553 | A1* | 11/2012 | Menegoli | H02J 7/0052 320/140 |
| 2012/0319789 | A1 | 12/2012 | Bhowmik et al. | |
| 2013/0015830 | A1* | 1/2013 | Zhang | H02M 1/14 323/282 |
| 2013/0063105 | A1* | 3/2013 | Nishida | H02M 3/156 323/271 |

(Continued)

FOREIGN PATENT DOCUMENTS

| EP | 3079249 A2 | 2/2016 |
| EP | 3079249 A3 | 2/2016 |

*Primary Examiner* — Jeffrey A Gblende

(57) ABSTRACT

Embodiments of ripple generation devices for a constant on-time voltage regulator and methods for ripple generation for a constant on-time voltage regulator are described. In one embodiment, a ripple generation device for a constant on-time voltage regulator includes a ripple generator configured to generate a ripple signal, a detector operably connected to the ripple generator and configured to detect a difference between an amplitude of the ripple signal and at least one reference amplitude and a feedback controller operably connected to the ripple generator and the detector and configured to generate a control signal for controlling the amplitude of the ripple signal based on the detected difference. Other embodiments are also described.

20 Claims, 12 Drawing Sheets

(56) References Cited

U.S. PATENT DOCUMENTS

2013/0063107 A1\* 3/2013 Nishida ............... H02M 3/1588
                                                                                                                    323/271
2014/0043562 A1   2/2014 Kikuchi
2015/0145490 A1\* 5/2015 Hang .................... H02M 3/158
                                                                                                                    323/271
2016/0294331 A1\* 10/2016 Ivanov ..................... H03F 1/26

\* cited by examiner

RIPPLE GENERATION DEVICE AND METHOD FOR A CONSTANT ON-TIME VOLTAGE REGULATOR

BACKGROUND

A DC-DC converter converts a direct current (DC) power source from one voltage level to another. A DC-DC converter may be, for example, a Buck DC-DC converter in which the input voltage is higher than the output voltage, a Boost DC-DC converter in which the input voltage is lower than the output voltage, or a Buck-Boost DC-DC converter in which the input voltage is higher or lower than the output voltage.

In a constant on-time voltage regulator, such as a Buck DC-DC converter, a Boost DC-DC converter, or a Buck-Boost DC-DC converter, a part of the output current of the DC-DC converter can be fed back to form a regulation loop. However, a propagation delay within the constant on-time voltage regulator can negatively impact the stability of the regulation loop of the constant on-time based DC-DC converter. For example, when the input voltage and the output voltage of the constant on-time voltage regulator are close to each other, the propagation delay within the constant on-time voltage regulator can cause sub-harmonic oscillation, which decreases the stability of the regulation loop of the constant on-time voltage regulator.

SUMMARY

Embodiments of ripple generation devices for a constant on-time voltage regulator and methods for ripple generation for a constant on-time voltage regulator are described. In an embodiment, a ripple generation device for a constant on-time voltage regulator includes a ripple generator configured to generate a ripple signal, a detector operably connected to the ripple generator and configured to detect a difference between an amplitude of the ripple signal and at least one reference amplitude and a feedback controller operably connected to the ripple generator and the detector and configured to generate a control signal for controlling the amplitude of the ripple signal based on the detected difference. Other embodiments are also described.

In an embodiment, the ripple generator includes an adjustable current source.

In an embodiment, the feedback controller is further configured to control a current value of the adjustable current source based on the detected difference.

In an embodiment, the ripple generator includes an adjustable capacitor.

In an embodiment, the feedback controller is further configured to control a capacitance of the adjustable capacitor based on the detected difference.

In an embodiment, the ripple generator includes an adjustable amplifier.

In an embodiment, the feedback controller is further configured to control a gain of the adjustable amplifier based on the detected difference.

In an embodiment, the ripple generator includes a Continuous Conduction Mode (CCM) ripple generator.

In an embodiment, the ripple generator includes a Discontinuous Conduction Mode (DCM) ripple generator.

In an embodiment, the feedback controller includes a counter.

In an embodiment, the feedback controller is configured to generate the control signal for controlling the amplitude of the ripple signal to be constant.

In an embodiment, the detector includes a plurality of voltage sources, a plurality of comparators operably connected to the voltage sources and to the feedback controller, an XOR gate operably connected to the comparators, and an AND gate operably connected to the XOR gate and the feedback controller.

In an embodiment, the voltage sources includes a first voltage source operably connected to a bias voltage, a second voltage source operably connected to a first comparator of the comparators and to the first voltage source, and a third voltage source operably connected to a second comparator of the comparators and to the first voltage source.

In an embodiment, the first voltage source has an adjustable voltage.

In an embodiment, an output of the first comparator is operably connected to a first input of the XOR gate and to a control terminal of the feedback controller.

In an embodiment, an output of the second comparator is operably connected to a second input of the XOR gate.

In an embodiment, a clock signal is applied to an input of the AND gate, and wherein an output of the AND gate is operably connected a clock terminal of the feedback controller.

In an embodiment, a constant on-time voltage regulator includes a power stage configured to convert an input direct current (DC) voltage into an output DC voltage, a driver device configured to drive the power stage, a timer configured to generate a constant on-time for the drive device, a ripple generation device configured to generate a ripple signal, and a comparator configured to perform voltage comparison in response to the ripple signal to generate an output to the timer. The ripple generation device includes a ripple generator configured to generate the ripple signal, a detector operably connected to the ripple generator and configured to detect a difference between an amplitude of the ripple signal and at least one reference amplitude and a feedback controller operably connected to the ripple generator and the detector and configured to generate a control signal for controlling the amplitude of the ripple signal based on the detected difference.

In an embodiment, the ripple generator includes at least one of an adjustable current source, an adjustable capacitor and an adjustable amplifier, and wherein the feedback controller is further configured to control at least one of a current value of the adjustable current source, a capacitance of the adjustable capacitor and a gain of the adjustable amplifier based on the detected difference.

In an embodiment, a method for ripple generation for a constant on-time voltage regulator involves generating a ripple signal, detecting a difference between an amplitude of the ripple signal and at least one reference amplitude and generating a control signal for controlling the amplitude of the ripple signal based on the detected difference.

Other aspects and advantages of embodiments of the present invention will become apparent from the following detailed description, taken in conjunction with the accompanying drawings, depicted by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
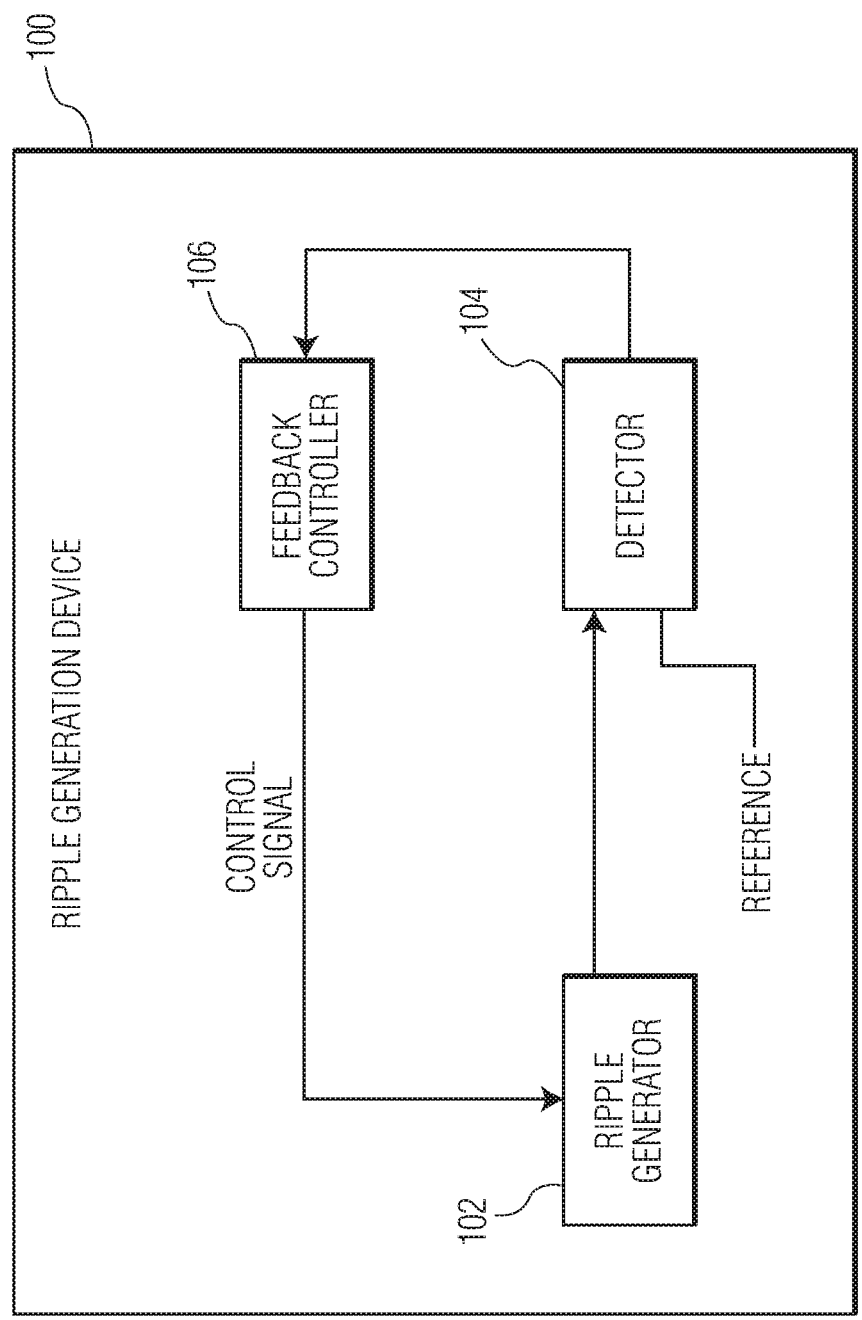
FIG. 1 is a schematic block diagram of a ripple generation device in accordance with an embodiment of the invention.

FIG. 1 is a schematic block diagram of a ripple generation device 100 in accordance with an embodiment of the invention. In the embodiment depicted in FIG. 1, the ripple generation device includes a ripple generator 102, a detector 104 and a feedback controller 106. The detector and the feedback controller form a feedback control loop. The ripple generation device can be used to provide ripple signals for a constant on-time voltage regulator, which may be, for example, a Buck constant on-time voltage regulator in which the input voltage is higher than the output voltage, a Boost constant on-time voltage regulator in which the input voltage is lower than the output voltage, or a Buck-Boost constant on-time voltage regulator in which the input voltage is higher or lower than the output voltage. In a constant on-time voltage regulator, an active and inactive cycle is provided depending on the input voltage such that a defined on and off time is generated. In some embodiments, a timing signal with a constant on time (i.e., the time duration of an active portion of the waveform of the timing signal being constant) is generated in a constant on-time voltage regulator. Although the ripple generation device is shown in FIG. 1 as including certain components, in some embodiments, the ripple generation device includes less or more components to implement less or more functionalities.

The ripple generation device 100 depicted in FIG. 1 can use feedback control to regulate ripple signal amplitude. For example, the ripple generation device can use feedback control to regulate ripple signal amplitude in order to achieve the constant ripple amplitude regardless of the change of other parameters in a constant on-time voltage regulator. When the input voltage and the output voltage of a constant on-time voltage regulator are close to each other, the ripple generation device can use feedback control to regulate ripple signal amplitude in order to achieve the constant ripple amplitude, which keeps the propagation delay within the constant on-time voltage regulator within a tolerance threshold. For example, when the ripple amplitude decreases, the ripple generation device can compensate for the decrease in ripple amplitude. Consequently, sub-harmonic oscillation caused by the propagation delay can be reduced or eliminated, and the stability of the regulation loop of the constant on-time voltage regulator can be maintained.

The ripple generator 102 of the ripple generation device 100 is configured to generate a ripple signal. In some embodiments, the ripple signal is a voltage signal having a triangular waveform or other suitable waveform. In some embodiments, the ripple signal is added or subtracted from another signal, which may be a DC signal (e.g., an output voltage, VOUT, of a voltage regulator in which the ripple generation device 100 is included or another DC signal). The ripple generator may be implemented using one or more analog circuits and/or one or more digital circuits.

The detector 104 of the ripple generation device 100 is operably connected to the ripple generator 102 and is configured to detect a difference between an amplitude of the ripple signal and at least one reference amplitude. In some embodiments, the detector is implemented using one or more analog circuits and/or one or more digital circuits.

The feedback controller 106 of the ripple generation device 100 is operably connected to the ripple generator 102 and the detector 104 and is configured to generate a control signal for controlling the amplitude of the ripple signal based on the detected difference. The feedback controller is implemented using one or more analog circuits and/or one or more digital circuits. In some embodiments, the feedback controller is implemented using a processor such as a microcontroller or a central processing unit (CPU).

Figure 2:
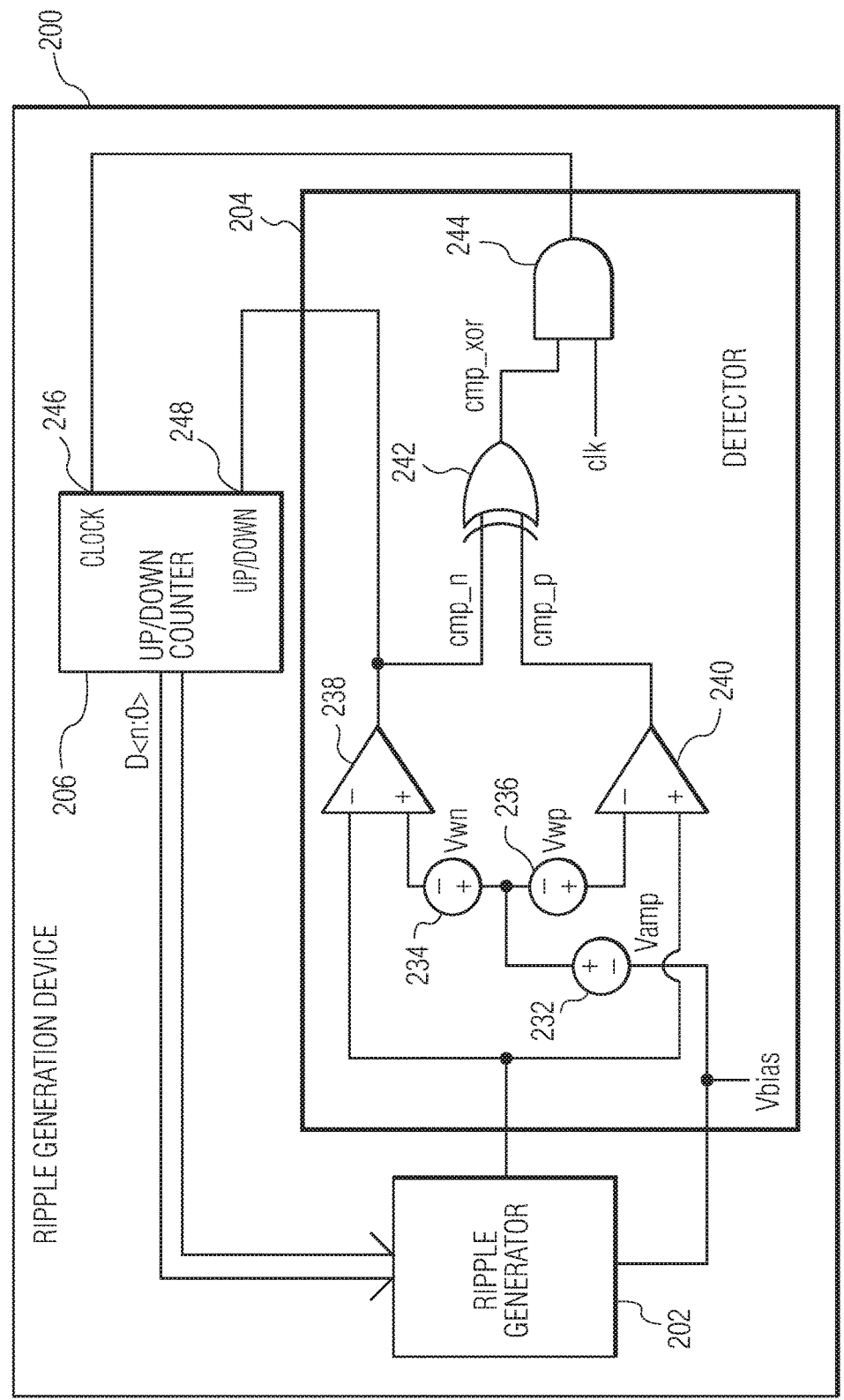
FIG. 2 depicts an embodiment of the ripple generation device of FIG. 1.

FIG. 2 depicts an embodiment of the ripple generation device 100 of FIG. 1. In the embodiment depicted in FIG. 2, a ripple generation device 200 includes a ripple generator 202, a detector 204 and an up/down counter 206. The ripple generator, the detector and the feedback controller form a feedback control loop. The ripple generation device can be used to provide ripple signals for a constant on-time voltage regulator. The ripple generation device 200 depicted in FIG. 2 is one possible embodiment of the ripple generation device 100 depicted in FIG. 1. Specially, the ripple generator 202, the detector 204 and the up/down counter 206 are embodiments of the ripple generator 102, the detector 104 and the feedback controller 106 depicted in FIG. 1, respectively. However, the ripple generation device depicted in FIG. 1 is not limited to the embodiment shown in FIG. 2.

The ripple generator 202 of the ripple generation device 200 is configured to generate a ripple signal. In the embodiment depicted in FIG. 2, a voltage, "Vbias," is applied to the ripple generator and to the detector 204. The voltage, Vbias, may be an output voltage of a constant on-time voltage regulator into which the ripple generation device 200 is included or other DC voltage. In some embodiments, the ripple generator is implemented using one or more analog circuits and/or one or more digital circuits.

The detector 204 of the ripple generation device 200 is operably connected to the ripple generator 202 and is configured to detect a difference between an amplitude of the ripple signal and at least one reference amplitude. In the embodiment depicted in FIG. 2, the detector includes a first voltage source 232 having a voltage, "Vamp," a second voltage source 234 having a voltage, "Vwn," a third voltage source 236 having a voltage, "Vwp," a first comparator 238, a second comparator 240, an XOR gate 242 and an AND gate 244. The first voltage source 232 is connected between the second voltage source 234 and the third voltage source 236. The second voltage source 234 is connected to the first comparator and the third voltage source 236 is connected to the second comparator. The first and second comparators are connected to inputs of the XOR gate. An output of the XOR gate and a clock signal, "clk," are connected to inputs of the AND gate.

The up/down counter 206 of the ripple generation device 200 is operably connected to the ripple generator 202 and the detector 204 and is configured to generate a control signal for controlling the amplitude of the ripple signal based on the detected difference. In the embodiment depicted in FIG. 2, the up/down counter includes a clock terminal 246 and an up/down control terminal 248. The up/down counter is implemented using one or more analog circuits and/or one or more digital circuits. In some embodiments, the up/down counter is implemented using a processor such as a microcontroller or a CPU. In the embodiment depicted in FIG. 2, the output of the AND gate 244 is input into the clock terminal of the up/down counter. In addition, an output signal, "cmp_n," of the first comparator is connected to the up/down control terminal of the up/down counter.

In an exemplary operation of the ripple generation device 200, when a ripple signal from the ripple generator reaches its peak value, the detector 204 compares the peak value with two reference voltages, vbias+Vamp+Vwp, and, vbias+Vamp−Vwn. If the peak value of the ripple signal is larger than vbias+Vamp+Vwp, the output signal, "cmp_p," of the second comparator 240, is at logic high (e.g., logic 1) while the output signal, cmp_n, of the first comparator 238 is at logic low (e.g., logic 0). Consequently, the output signal, "cmp_xor," of the XOR gate 242 is at logic high (e.g., logic 1). Because the output signal, cmp_xor, of the XOR gate is at logic high, the output signal of the AND gate 244 is the clock signal, clk, which is then input into the clock terminal 246 of the up/down counter 206. Because the output signal, cmp_n, of the first comparator is at logic low, the counter value of the up/down counter decreases and the up/down counter instructs the ripple generator to reduce the ripple amplitude. If the peak value of the ripple signal is smaller than vbias+Vamp−Vwn, the output signal, cmp_n, of the first comparator 238 is at high while the output signal, cmp_p, of the second comparator 240 is at logic low. Consequently, the output signal, cmp_xor, of the XOR gate 242 is at logic high (e.g., logic 1). Because the output signal, cmp_xor, of the XOR gate is at logic high, the output signal of the AND gate 244 is the clock signal, clk, which is then input into the clock terminal 246 of the up/down counter 206. Because the output signal, cmp_n, of the first comparator is at logic low, the counter value of the up/down counter increases and the up/down counter instructs the ripple generator to increase the ripple amplitude. If the peak value of the ripple signal is between vbias+Vamp−Vwn and vbias+Vamp+Vwp, the output signal, cmp_p, of the second comparator 240 is at logic low while the output signal, cmp_n, of the first comparator 238 is also at logic low. Consequently, the output signal, cmp_xor, of the XOR gate 242 is at logic low. Because the output signal, cmp_xor, of the XOR gate is at logic low, the output signal of the AND gate 244 is at logic low, which is then input into the clock terminal 246 of the up/down counter 206. Consequently, the up/down counter keeps its output counter value not changed and the ripple generator maintains the ripple signal amplitude. Because the valley value of the ripple signal is vbias, the amplitude of the ripple signal (delta between peak and valley) can be regulated to the value between Vamp−Vwn and Vamp+Vwp.

Figure 3:
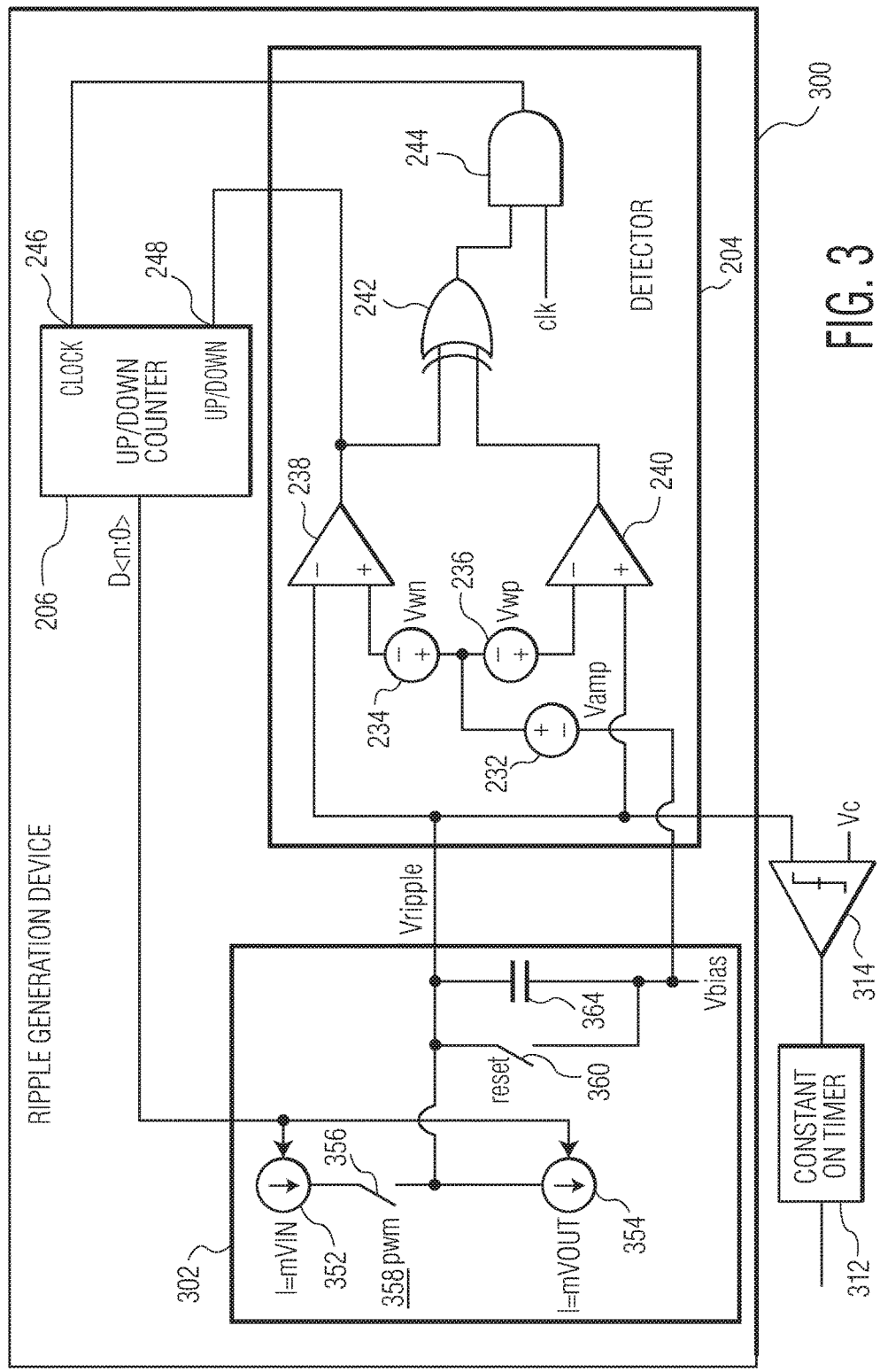
FIG. 3 depicts an embodiment of the ripple generation device of FIG. 2 with a CCM ripple generator having adjustable current sources.

In some embodiments, the ripple generation device 200 of FIG. 2 is a Continuous Conduction Mode (CCM) ripple generation device that produces a continuous ripple waveform. FIG. 3 depicts an embodiment of the ripple generation device 200 of FIG. 2 with a Continuous Conduction Mode (CCM) ripple generator 302 having adjustable current sources 352, 354. In the embodiment depicted in FIG. 3, a ripple generation device 300 includes the ripple generator 302, the detector 204 and the up/down counter 206. The detector and the feedback controller form a feedback control loop. The ripple generation device can be used to provide ripple signals for a constant on-time voltage regulator. In the embodiment depicted in FIG. 3, a voltage, Vbias, is applied to the ripple generator and to the detector. The voltage, Vbias, may be an output voltage of a constant on-time voltage regulator into which the ripple generation device is included or other DC voltage. The ripple generation device 300 depicted in FIG. 3 is one possible embodiment of the ripple generation device 200 depicted in FIG. 2. Specially, the ripple generator 302 depicted in FIG. 3 is an embodiment of the ripple generator 202 depicted in FIG. 2. However, the ripple generation device depicted in FIG. 2 is not limited to the embodiment shown in FIG. 3.

In the embodiment depicted in FIG. 3, the ripple generator 302 includes the first current source 352 with an adjustable current of "mVIN," (where m is a control factor or coefficient), the second current source 354 with an adjustable current of "mVOUT," a first switch 356 that is controlled by a Pulse Width Modulation (PWM) signal 358 or other control signal, a second switch 360 that is controlled by a reset signal 362, and a capacitor, 364. The value of the control factor or coefficient, m, is controlled by the up/down counter 206. The control factor or coefficient, m, may be linear or non-linear with respect to the output of the up/down counter and/or the control signal at the up/down control terminal 248. The ripple generator is configured to generate a ripple voltage signal, "Vripple." In the embodiment depicted in FIG. 3, the ripple voltage signal, Vripple, and a reference voltage, "Vc," are applied to inputs of a comparator 314 of a constant on-time voltage regulator in which the ripple generator is included. The output of the comparator is connected to a constant on timer 312 of the constant on-time voltage regulator. The constant on timer may be implemented by any type of on timer that can generate a timing signal with an active portion having fixed time duration. In some embodiments, the constant on timer is implemented using at least one processor such as a microcontroller or a CPU.

In an exemplary operation of the ripple generation device 300, the detector 204 compares the ripple voltage signal, Vripple, with two reference voltages, vbias+Vamp+Vwp, and, vbias+Vamp−Vwn. Depending on the relationships between the ripple voltage signal, Vripple, with the two reference voltages, vbias+Vamp+Vwp, and, vbias+Vamp−Vwn, the outputs of the first and second comparators 238, 240, the XOR gate 242 and the AND gate 244 are set and the up/down counter 206 is controlled, similarly or identical to the operation of the ripple generation device 200 described with reference to FIG. 2. When the counter value of the up/down counter decreases and the up/down counter instructs the ripple generator to reduce the ripple amplitude, the value of m for the first and second current sources 352, 354 with the adjustable currents of mVIN, mVOUT, is reduced. When the counter value of the up/down counter increases and he up/down counter instructs the ripple generator to increase the ripple amplitude, the value of m for the first and second current sources 352, 354 with the adjustable currents of mVIN, mVOUT, is increased. When the up/down counter keeps its output counter value not changed and the ripple generator maintains the ripple signal amplitude, the value of m for the first and second current sources 352, 354 with the adjustable currents of mVIN, mVOUT, is maintained at its current value.

Figure 4:
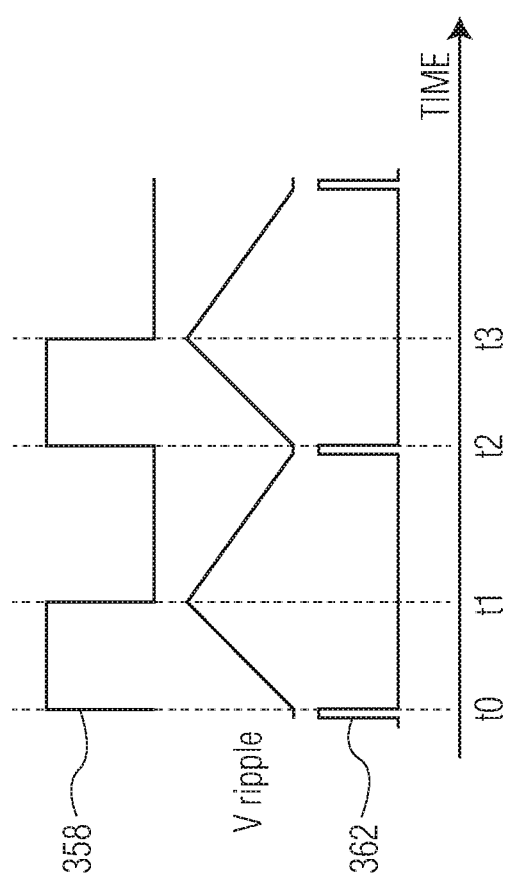
FIG. 4 is a signal timing diagram corresponding to the CCM ripple generation device depicted in FIG. 3.

FIG. 4 is a signal timing diagram corresponding to the CCM ripple generation device 300 depicted in FIG. 3. Signals illustrated in FIG. 4 include the PWM signal 358 for the first switch 356, the ripple voltage signal, Vripple, and the reset signal 362 for the second switch 360. Circuit mismatch in a previous charging/discharging cycle may cause some residue voltage at the capacitor 346. The reset signal 362 can be used to ensure that each time when the charging of the capacitor 364 starts, the capacitor 364 is discharged first by, for example, shorting top and bottom plates of the capacitor 364, in order to allow that the capacitor voltage starts from zero. At time point, t0, on a rising edge of the PWM signal and a falling edge of the reset signal, the ripple voltage signal, Vripple, begins to increase. At time point, t1, on a falling edge of the PWM signal, the ripple voltage signal, Vripple, reaches its peak. At time point, t2, on a rising edge of the PWM signal and a falling edge of the reset signal, the ripple voltage signal, Vripple, reaches its dip. At time point, t3, on a falling edge of the PWM signal, the ripple voltage signal, Vripple, reaches its peak.

Figure 5:
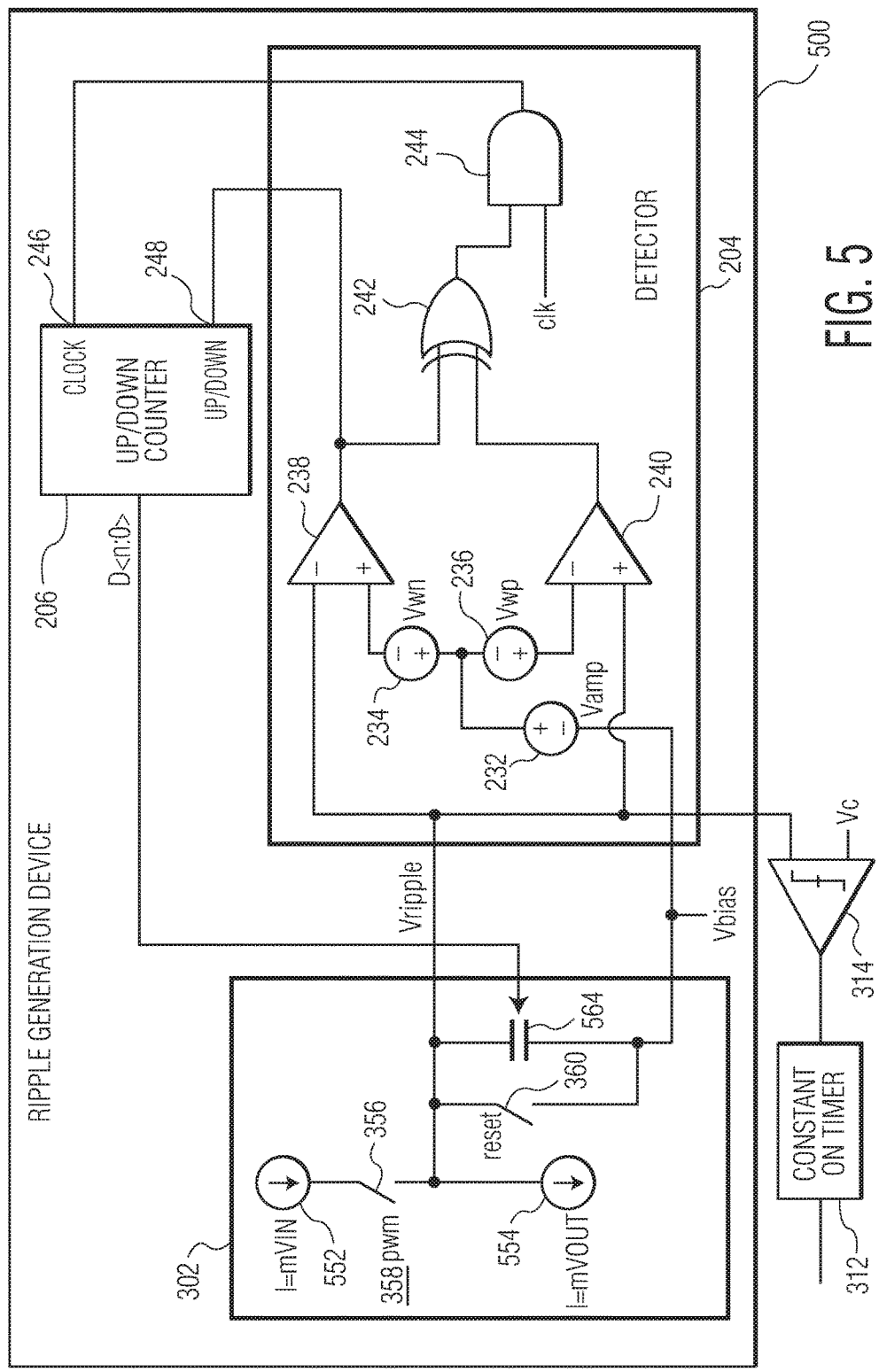
FIG. 5 depicts an embodiment of the ripple generation device of FIG. 2 with a CCM ripple generator with an adjustable capacitor.

FIG. 5 depicts an embodiment of the ripple generation device 200 of FIG. 2 with a CCM ripple generator 502 with an adjustable capacitor 564. In the embodiment depicted in FIG. 5, a ripple generation device 500 includes the ripple generator 502, the detector 204 and the up/down counter 206. The detector and the feedback controller form a feedback control loop. The ripple generation device can be used to provide ripple signals for a constant on-time voltage regulator. In the embodiment depicted in FIG. 5, a voltage, Vbias, is applied to the ripple generator and to the detector. The voltage, Vbias, may be an output voltage of a constant on-time voltage regulator into which the ripple generation device is included or other DC voltage. The ripple generation device 500 depicted in FIG. 5 is one possible embodiment of the ripple generation device 200 depicted in FIG. 2. Specially, the ripple generator 502 depicted in FIG. 5 is an embodiment of the ripple generator 202 depicted in FIG. 2. However, the ripple generation device depicted in FIG. 2 is not limited to the embodiment shown in FIG. 5.

In the embodiment depicted in FIG. 5, the ripple generator 502 includes a first current source 552 with a current of mVIN, (where m is a control factor or coefficient), a second current source 554 with a current of mVOUT, the first switch 356 that is controlled by the PWM signal 358 or other control signal, the second switch 360 that is controlled by the reset signal 362, and a capacitor 564 with adjustable capacitance. The capacitor may include multiple capacitance sections, such as capacitor banks, that can be activated or deactivated to increase or decrease its capacitance by the up/down counter 206. The value of the control factor or coefficient, m, is controlled by the up/down counter 206. The control factor or coefficient, m, may be linear or non-linear with respect to the output of the up/down counter and/or the control signal at the up/down control terminal 248. The ripple generator is configured to generate a ripple voltage signal, Vripple. In the embodiment depicted in FIG. 5, the ripple voltage signal, Vripple, and a reference voltage, Vc, are applied to inputs of the comparator 314 of a constant on-time voltage regulator in which the ripple generator is included. The output of the comparator is connected to the constant on timer 312 of the constant on-time voltage regulator.

In an exemplary operation of the ripple generation device 500, the detector 204 compares the ripple voltage signal, Vripple, with two reference voltages, vbias+Vamp+Vwp, and, vbias+Vamp−Vwn. Depending on the relationships between the ripple voltage signal, Vripple, with the two reference voltages, vbias+Vamp+Vwp, and, vbias+Vamp−Vwn, the outputs of the first and second comparators 238, 240, the XOR gate 242 and the AND gate 244 are set and the up/down counter 206 is controlled, similarly or identical to the operation of the ripple generation device 200 described with reference to FIG. 2. When the counter value of the up/down counter decreases and the up/down counter instructs the ripple generator to reduce the ripple amplitude, the capacitance of the capacitor 564 is reduced. When the counter value of the up/down counter increases and he up/down counter instructs the ripple generator to increase the ripple amplitude, the capacitance of the capacitor is increased. When the up/down counter keeps its output counter value not changed and the ripple generator maintains the ripple signal amplitude, the capacitance of the capacitor is maintained at its current capacitance value.

Figure 6:
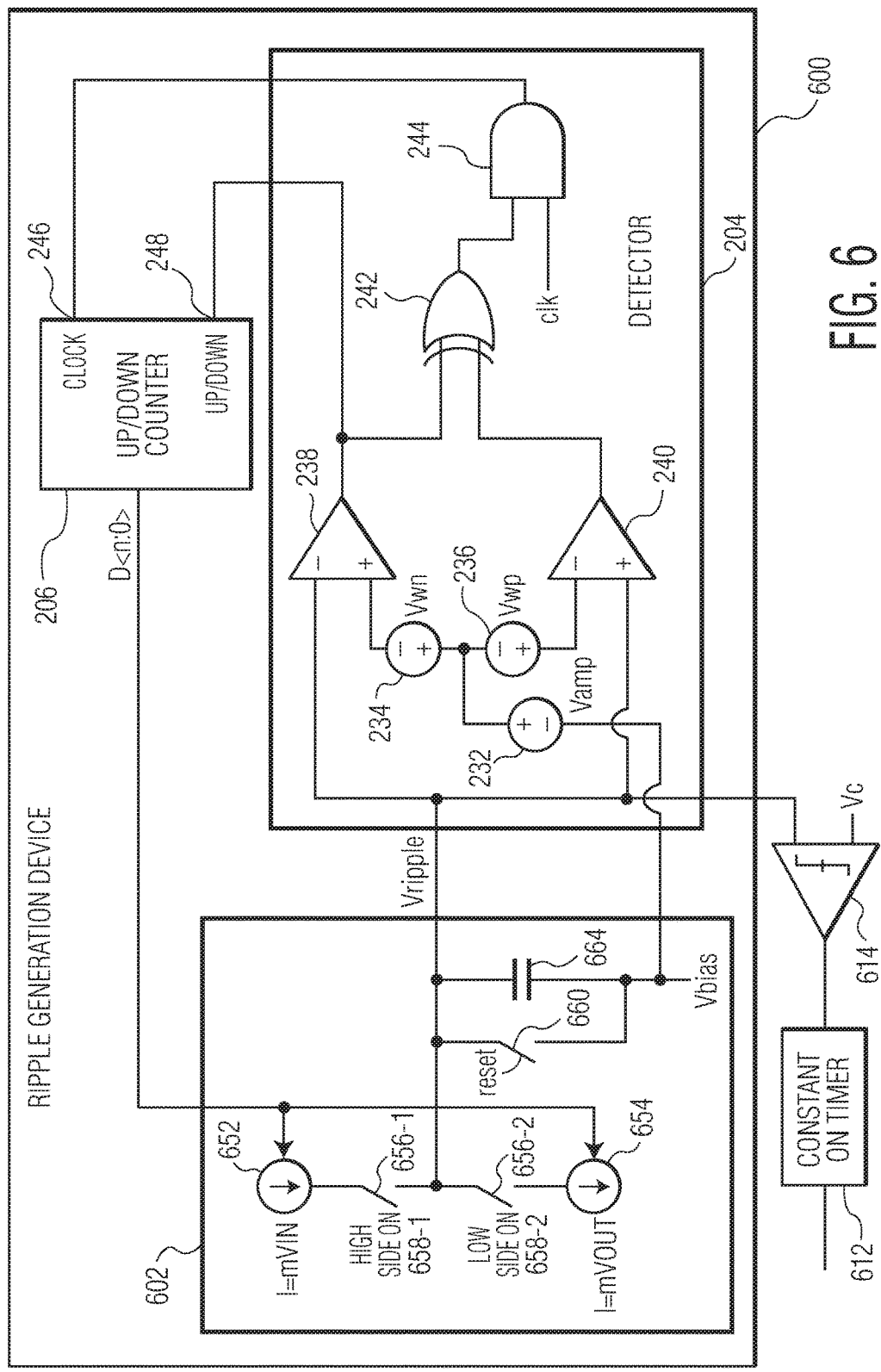
FIG. 6 depicts an embodiment of the ripple generation device of FIG. 2 with a DCM ripple generator having adjustable current sources.

In some embodiments, the ripple generation device 200 of FIG. 2 is a Discontinuous Conduction Mode (DCM) ripple generation device that produces a discontinuous ripple waveform. FIG. 6 depicts an embodiment of the ripple generation device 200 of FIG. 2 with a DCM ripple generator 602 having adjustable current sources 652, 654. In the embodiment depicted in FIG. 6, a ripple generation device 600 includes the ripple generator 602, the detector 204 and the up/down counter 206. The detector and the feedback controller form a feedback control loop. The ripple generation device can be used to provide ripple signals for a constant on-time voltage regulator. In the embodiment depicted in FIG. 6, a voltage, Vbias, is applied to the ripple generator and to the detector. The voltage, Vbias, may be an output voltage of a constant on-time voltage regulator into which the ripple generation device is included or other DC voltage. The ripple generation device 600 depicted in FIG. 6 is one possible embodiment of the ripple generation device 200 depicted in FIG. 2. Specially, the ripple generator 602 depicted in FIG. 6 is an embodiment of the ripple generator 202 depicted in FIG. 2. However, the ripple generation device depicted in FIG. 2 is not limited to the embodiment shown in FIG. 6.

In the embodiment depicted in FIG. 6, the ripple generator 602 includes the first current source 652 with an adjustable current of "mVIN," (where m is a control factor or coefficient), the second current source 654 with an adjustable current of "mVOUT," a high-side switch 356-1 that is controlled by a control signal 658-1 (e.g., a PWM signal), a low-side switch 356-2 that is controlled by a control signal 658-2 (e.g., a PWM signal), a second switch 660 that is controlled by a reset signal 662, and a capacitor, 664. The value of the control factor or coefficient, m, is controlled by the up/down counter 206. The control factor or coefficient, m, may be linear or non-linear with respect to the output of the up/down counter and/or the control signal at the up/down control terminal 248. The ripple generator is configured to generate a ripple voltage signal, Vripple. In the embodiment depicted in FIG. 6, the ripple voltage signal, Vripple, and a reference voltage, Vc, are applied to inputs of a comparator 614 of a constant on-time voltage regulator in which the ripple generator is included. The output of the comparator is connected to a constant on timer 612 of the constant on-time voltage regulator. The constant on timer may be implemented by any type of on timer that can generate a timing signal with an active portion having fixed time duration. In some embodiments, the constant on timer is implemented using at least one processor such as a microcontroller or a CPU.

In an exemplary operation of the ripple generation device 600, the detector 604 compares the ripple voltage signal, Vripple, with two reference voltages, vbias+Vamp+Vwp, and, vbias+Vamp−Vwn. Depending on the relationships between the ripple voltage signal, Vripple, with the two reference voltages, vbias+Vamp+Vwp, and, vbias+Vamp−Vwn, the outputs of the first and second comparators 238, 240, the XOR gate 242 and the AND gate 244 are set and the up/down counter 206 is controlled, similarly or identical to the operation of the ripple generation device 200 described with reference to FIG. 2. When the counter value of the up/down counter decreases and the up/down counter instructs the ripple generator to reduce the ripple amplitude, the value of m for the first and second current sources 652, 654 with the adjustable currents of mVIN, mVOUT, is reduced. When the counter value of the up/down counter increases and he up/down counter instructs the ripple generator to increase the ripple amplitude, the value of m for the first and second current sources 652, 654 with the adjustable currents of mVIN, mVOUT, is increased. When the up/down counter keeps its output counter value not changed and the ripple generator maintains the ripple signal amplitude, the value of m for the first and second current sources 652, 654 with the adjustable currents of mVIN, mVOUT, is maintained at its current value.

Figure 7:
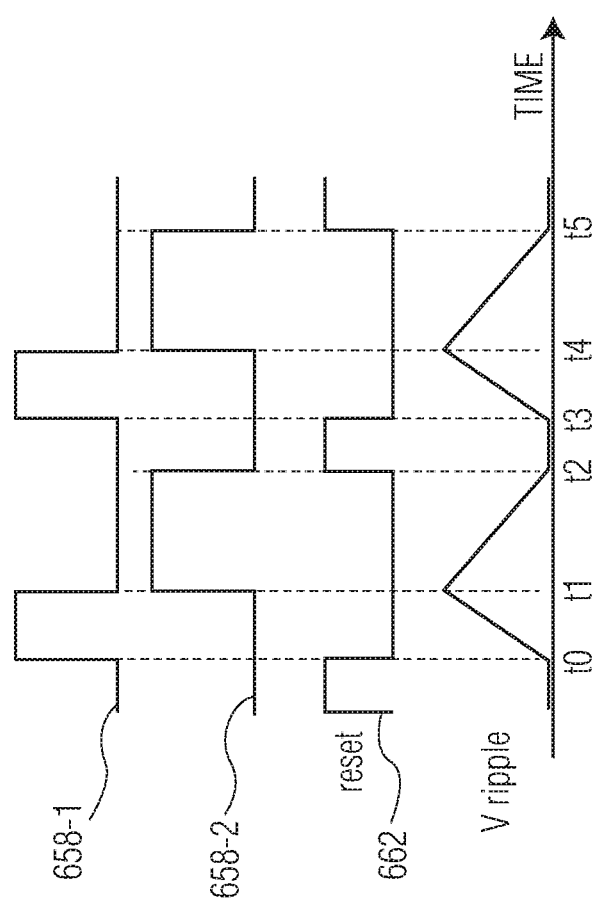
FIG. 7 is a signal timing diagram corresponding to the DCM ripple generation device depicted in FIG. 6.

FIG. 7 is a signal timing diagram corresponding to the DCM ripple generation device 600 depicted in FIG. 6. Signals illustrated in FIG. 7 include the PWM signal 658-1 for the switch 656-1, the PWM signal 658-2 for the switch 656-2, the ripple voltage signal, Vripple, and the reset signal 662 for the second switch 660. At time point, t0, on a rising edge of the PWM signal 658-1 and a falling edge of the reset signal, the ripple voltage signal, Vripple, begins to increase. At time point, t1, on a falling edge of the PWM signal 658-1 and a rising edge of the PWM signal 658-2, the ripple voltage signal, Vripple, reaches its peak. At time point, t2, on a falling edge of the PWM signal 658-2 and a rising edge of the reset signal, the ripple voltage signal, Vripple, reaches its dip. At time point, t3, on a rising edge of the PWM signal 658-1 and a falling edge of the reset signal, the ripple voltage signal, Vripple, begins to increase again. At time point, t4, on a falling edge of the PWM signal 658-1 and a rising edge of the PWM signal 658-2, the ripple voltage signal, Vripple, reaches its peak. At time point, t5, on a falling edge of the PWM signal 658-2 and a rising edge of the reset signal, the ripple voltage signal, Vripple, reaches its dip.

Figure 8:
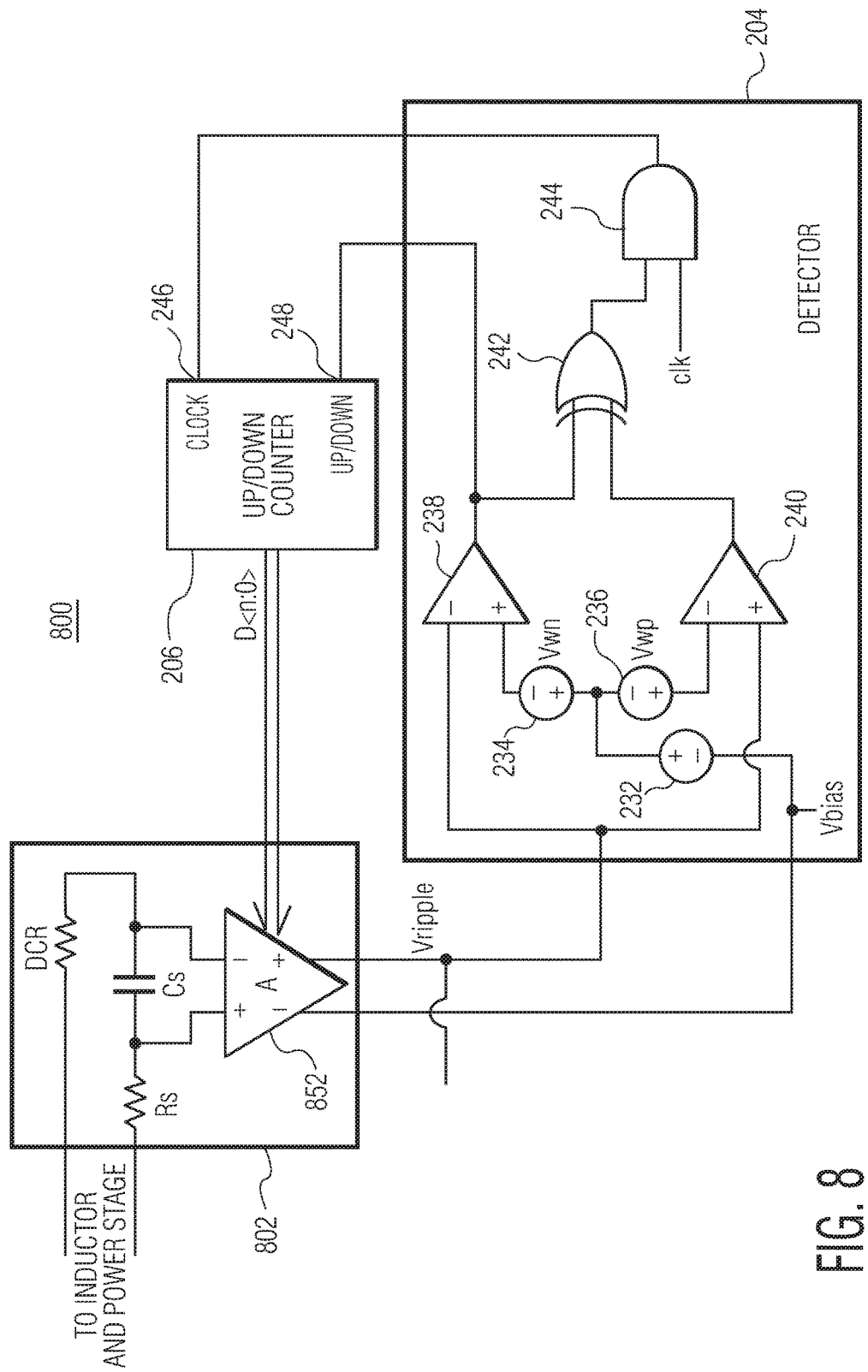
FIG. 8 depicts an embodiment of the ripple generation device of FIG. 2 with a ripple generator with an amplifier with an adjustable gain.

In some embodiments, the ripple generation device 200 of FIG. 2 generates ripple signals based on inductor DC resistance (DCR) current sensing. FIG. 8 depicts an embodiment of the ripple generation device 200 of FIG. 2 with a ripple generator 802 with an amplifier 852 with an adjustable gain for DCR current sensing. In the embodiment depicted in FIG. 8, a ripple generation device 800 includes the ripple generator 802, the detector 204 and the up/down counter 206. The ripple generator 802 includes the amplifier 852 with an adjustable gain, a resistor, Rs, a capacitor Cs, and a resistor, DCR. The resistor, Rs, the capacitor Cs, and the resistor, DCR, may be connected to an inductor and a power stage of a constant on-time voltage regulator into which the ripple generation device 800 is included. The ripple generator is configured to generate a ripple voltage signal, Vripple. The ripple generator, the detector and the feedback controller form a feedback control loop. The ripple generation device can be used to provide ripple signals for a constant on-time voltage regulator. In the embodiment depicted in FIG. 8, a voltage, Vbias, is applied to the ripple generator and to the detector. The voltage, Vbias, may be an output voltage of a constant on-time voltage regulator into which the ripple generation device 800 is included or other DC voltage. The ripple generation device 800 depicted in FIG. 8 is one possible embodiment of the ripple generation device 200 depicted in FIG. 2. Specially, the ripple generator 802 depicted in FIG. 8 is an embodiment of the ripple generator 202 depicted in FIG. 2. However, the ripple generation device depicted in FIG. 2 is not limited to the embodiment shown in FIG. 8.

Figure 9:
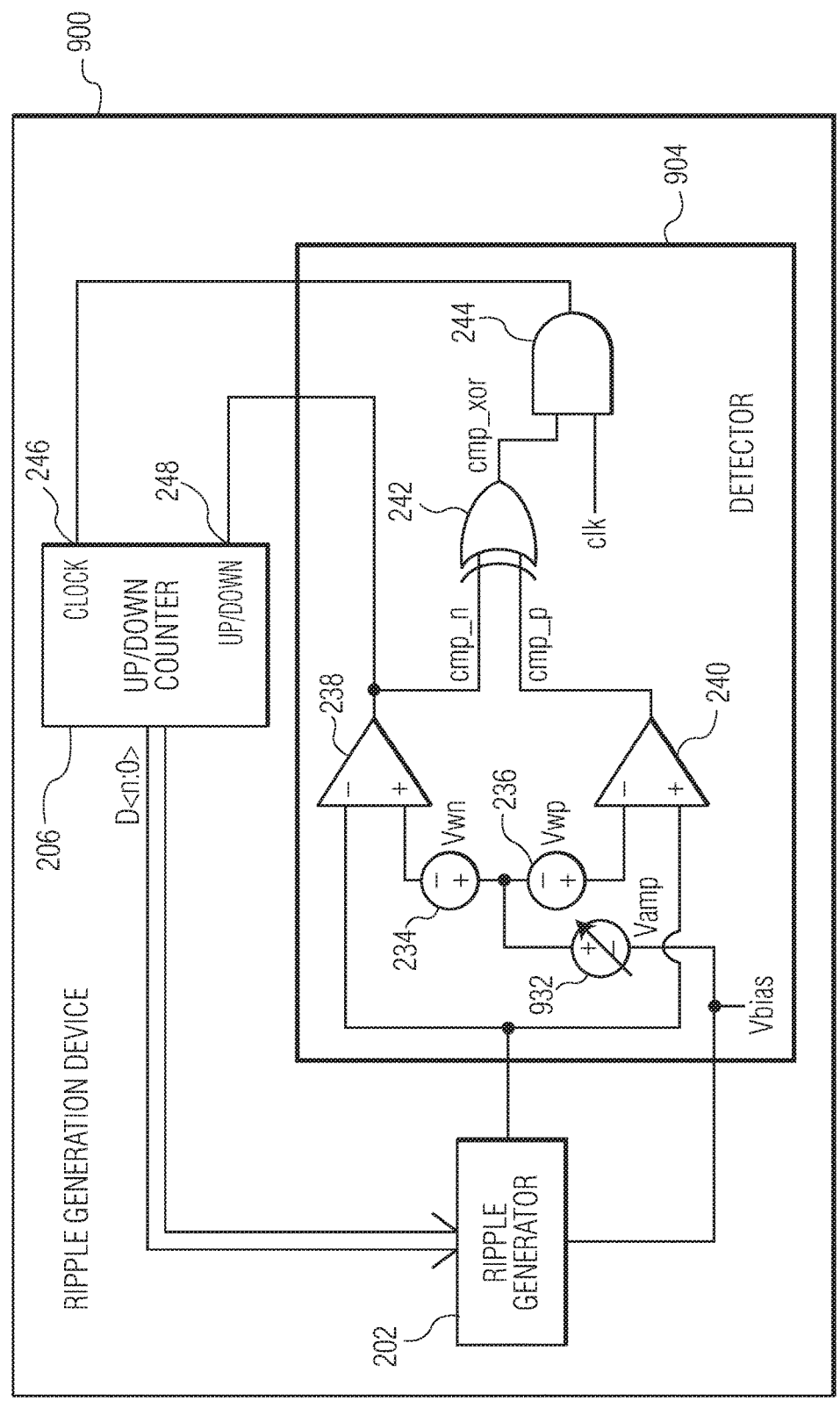
FIG. 9 depicts another embodiment of the ripple generation device of FIG. 1.

FIG. 9 depicts another embodiment of the ripple generation device 100 of FIG. 1. In the embodiment depicted in FIG. 9, a ripple generation device 900 includes the ripple generator 202, a detector 904 and the up/down counter 206. The detector and the feedback controller form a feedback control loop. The ripple generation device can be used to provide ripple signals for a constant on-time voltage regulator. The ripple generation device 900 depicted in FIG. 9 is one possible embodiment of the ripple generation device 100 depicted in FIG. 1. However, the ripple generation device depicted in FIG. 1 is not limited to the embodiment shown in FIG. 9. A difference between the ripple generation device 900 depicted in FIG. 9 and the ripple generation device 200 depicted in FIG. 2 is that the detector 904 depicted in FIG. 9 includes an adjustable voltage source 932 having an adjustable voltage, Vamp. Specifically, in the embodiment depicted in FIG. 9, the detector includes the adjustable voltage source 932 having an adjustable voltage, Vamp, the second voltage source 234 having a voltage, Vwn, the third voltage source 236 having a voltage, Vwp, the first comparator 238, the second comparator 240, the XOR gate 242 and the AND gate 244. The voltage value of Vamp can be changed according to different input and output voltage combinations of a constant on-time voltage regulator in which the ripple generation device is included. In some embodiments, the voltage value of Vamp is changed by feed-forward control (e.g., from an input voltage and/or an output voltage of a constant on-time voltage regulator in which the ripple generation device is included).

Figure 10:
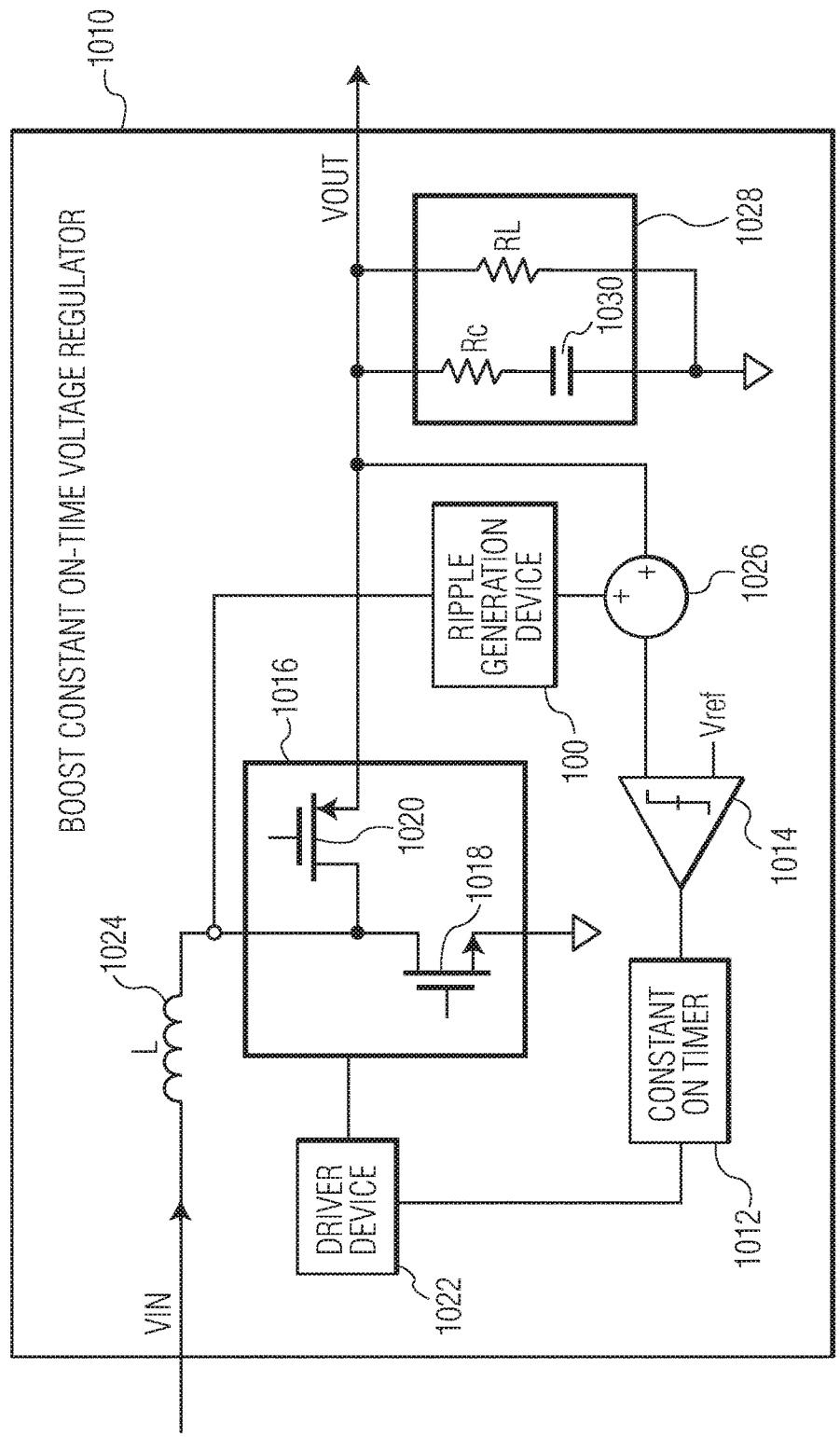
FIG. 10 depicts an embodiment of a Boost constant on-time voltage regulator in which the ripple generation device of FIG. 1 can be used.

FIG. 10 depicts an embodiment of a Boost constant on-time voltage regulator 1010 in which the ripple generation device 100 of FIG. 1 can be used. In the embodiment depicted in FIG. 10, the Boost constant on-time voltage regulator includes the ripple generation device 100, a constant on timer 1012, a comparator 1014, a power stage circuit 1016 that includes power field-effect transistors (FETs) 1018, 1020, a driver device 1022, an inductor 1024, a voltage summation device 1026, and an optional RC network 1028, which includes a capacitor 1030 and resistors RC, RL. The RC network can be used as a load for the boost constant on-time voltage regulator. In some embodiments, the RC network is not a component of the boost constant on-time voltage regulator. The ripple generation device 100, the comparator and the constant on timer form a feedback control loop. The driver device is a common voltage regulator component, and consequently is not described in detail herein. In some embodiments, the driver device is implemented using at least one processor such as a microcontroller or a CPU. The constant on timer is a common voltage regulator component, and consequently is not described in detail herein. The constant on timer may be implemented by any type of on timer that can generate a timing signal having an active portion with fixed time duration. In some embodiments, the constant on timer is implemented using at least one processor such as a microcontroller or a CPU. The boost constant on-time voltage regulator converts an input voltage, VIN, into an output voltage, VOUT, which is higher than the input voltage, VIN. Although the Boost constant on-time voltage regulator is shown in FIG. 10 as including certain components, in some embodiments, the Boost constant on-time voltage regulator includes less or more components to implement less or more functionalities.

In the embodiment depicted in FIG. 10, the ripple generation device 100 is configured to generate a ripple signal for the boost constant on-time voltage regulator 1010. The voltage summation device 1026 is configured to sum up the voltage of the ripple signal that is generated by the ripple generation device with the output voltage, VOUT, of the boost constant on-time voltage regulator. The comparator 1014 is configured to compare the result from the voltage summation device with a reference voltage, Vref. The constant on timer 1012 is configured to provide an active and inactive cycle depending on the input voltage, started by the comparator 1014, such that a defined on and off time is generated. The driver device is configured to drive the power stage based on the timing signal received from the constant on timer. The power stage is configured to convert an input voltage, VIN, received through the inductor 1024 into the output voltage, VOUT, of the boost constant on-time voltage regulator using the power FETs 1018, 1020.

Figure 11:
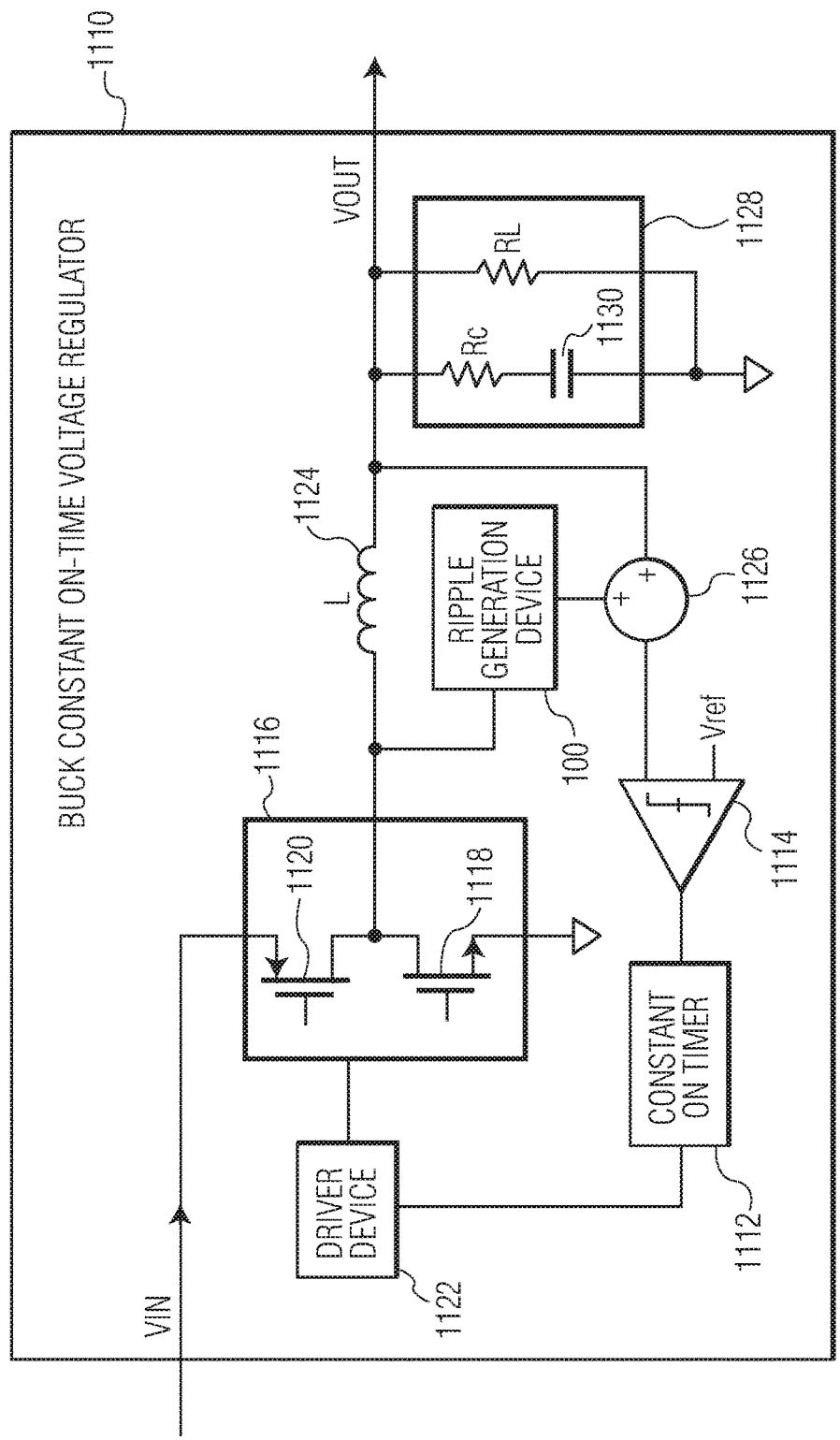
FIG. 11 depicts an embodiment of a Buck constant on-time voltage regulator in which the ripple generation device of FIG. 1 can be used.

FIG. 11 depicts an embodiment of a Buck constant on-time voltage regulator 1110 in which the ripple generation device 100 of FIG. 1 can be used. In the embodiment depicted in FIG. 11, the Buck constant on-time voltage regulator includes the ripple generation device 100, a constant on timer 1112, a comparator 1114, a power stage circuit 1116 includes power FETs 1118, 1120, a driver device 1122, an inductor 1124, a voltage summation device 1126, and an optional RC network 1128, which includes a capacitor 1130 and resistors RC, RL. The RC network can be used as a load for the boost constant on-time voltage regulator. In some embodiments, the RC network is not a component of the boost constant on-time voltage regulator. The driver device, the power stage circuit, the comparator, and the constant on timer form a feedback control loop. The driver device is a common voltage regulator component, and consequently is not described in detail herein. In some embodiments, the driver device is implemented using at least one processor such as a microcontroller or a CPU. The constant on timer is a common voltage regulator component, and consequently is not described in detail herein. The constant on timer may be implemented by any type of on timer that can generate a timing signal having an active portion with fixed time duration. In some embodiments, the constant on timer is implemented using at least one processor such as a microcontroller or a CPU. The Buck constant on-time voltage regulator converts an input voltage, VIN, into an output voltage, VOUT, which is lower than the input voltage, VIN. Although the Buck constant on-time voltage regulator is shown in FIG. 11 as including certain components, in some embodiments, the Buck constant on-time voltage regulator includes less or more components to implement less or more functionalities.

In the embodiment depicted in FIG. 11, the ripple generation device 100 is configured to generate a ripple signal for the buck constant on-time voltage regulator 1110. The voltage summation device 1126 is configured to sum up the voltage of the ripple signal that is generated by the ripple generation device with the output voltage, VOUT, of the buck constant on-time voltage regulator. The comparator 1114 is configured to compare the result from the voltage summation device with a reference voltage, Vref. The constant on timer 1112 is configured to provide an active and inactive cycle depending on the input voltage, started by the comparator 1014, such that a defined on and off time is generated. In some embodiments, the constant on timer generates a timing signal with a constant on time. The driver device is configured to drive the power stage based on the timing signal received from the constant on timer. The power stage and the inductor 1124 are configured to convert an input voltage, VIN, into the output voltage, VOUT, of the buck constant on-time voltage regulator using the power FETs 1118, 1120.

Figure 12:
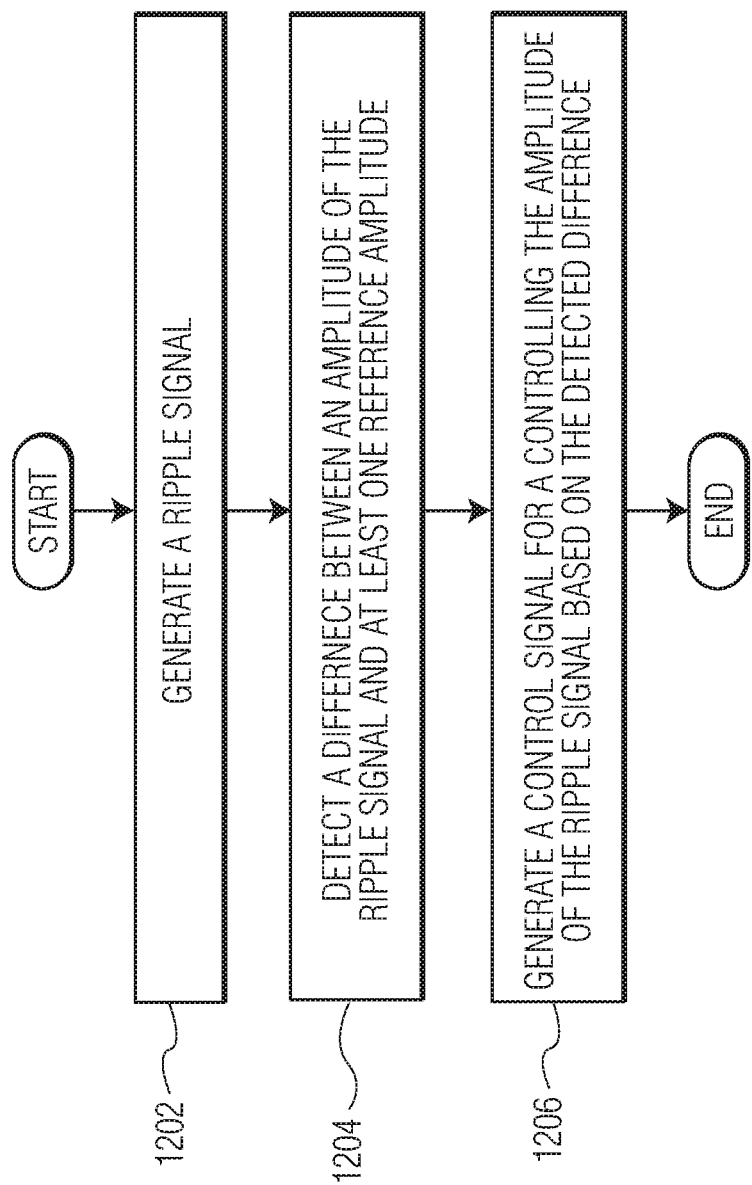
FIG. 12 is a process flow diagram of a method for ripple generation for a constant on-time voltage regulator in accordance with an embodiment of the invention.

FIG. 12 is a process flow diagram of a method for ripple generation for a constant on-time voltage regulator in accordance with an embodiment of the invention. At block 1202, a ripple signal is generated. At block 1204, a difference between an amplitude of the ripple signal and at least one reference amplitude is detected. At block 1206, a control signal for controlling the amplitude of the ripple signal is generated based on the detected difference. The constant on-time voltage regulator may be similar to or the same as the boost constant on-time voltage regulator 1010 depicted in FIG. 10 and/or the buck constant on-time voltage regulator 1110 depicted in FIG. 11.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more features.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A ripple generation device for a constant on-time voltage regulator, the ripple generation device comprising:
    a ripple generator configured to generate a ripple signal;
    a detector operably connected to the ripple generator and configured to detect a difference between an amplitude of the ripple signal and a first reference amplitude and a second reference amplitude; and
    a feedback controller operably connected to the ripple generator and the detector and configured to generate a control signal for controlling the amplitude of the ripple signal based on the detected difference;
    wherein if the amplitude of the ripple signal is above the first reference amplitude, the control signal decreases the amplitude of the ripple signal, and if the amplitude of the ripple signal is below the second reference amplitude, the control signal increases the amplitude of the ripple signal.

2. The ripple generation device of claim 1, wherein the ripple generator comprises an adjustable current source.

3. The ripple generation device of claim 2, wherein the feedback controller is further configured to control a current value of the adjustable current source based on the detected difference.

4. The ripple generation device of claim 1, wherein the ripple generator comprises an adjustable capacitor.

5. The ripple generation device of claim 4, wherein the feedback controller is further configured to control a capacitance of the adjustable capacitor based on the detected difference.

6. The ripple generation device of claim 1, wherein the ripple generator comprises an adjustable amplifier.

7. The ripple generation device of claim 6, wherein the feedback controller is further configured to control a gain of the adjustable amplifier based on the detected difference.

8. The ripple generation device of claim 1, wherein the ripple generator comprises a Continuous Conduction Mode (CCM) ripple generator.

9. The ripple generation device of claim 1, wherein the ripple generator comprises a Discontinuous Conduction Mode (DCM) ripple generator.

10. The ripple generation device of claim 1, wherein the feedback controller comprises a counter.

11. The ripple generation device of claim 1, wherein the feedback controller is configured to generate the control signal for controlling the amplitude of the ripple signal to be constant.

12. The ripple generation device of claim 1, wherein the detector comprises:
    a plurality of voltage sources;
    a plurality of comparators operably connected to the voltage sources and to the feedback controller;
    an XOR gate operably connected to the comparators; and
    an AND gate operably connected to the XOR gate and the feedback controller.

13. The ripple generation device of claim 12, wherein the voltage sources comprises:
    a first voltage source operably connected to a bias voltage;
    a second voltage source operably connected to a first comparator of the comparators and to the first voltage source; and
    a third voltage source operably connected to a second comparator of the comparators and to the first voltage source.

14. The ripple generation device of claim 13, wherein the first voltage source has an adjustable voltage.

15. The ripple generation device of claim 13, wherein an output of the first comparator is operably connected to a first input of the XOR gate and to a control terminal of the feedback controller.

16. The ripple generation device of claim 15, wherein an output of the second comparator is operably connected to a second input of the XOR gate.

17. The ripple generation device of claim 15, wherein a clock signal is applied to an input of the AND gate, and wherein an output of the AND gate is operably connected a clock terminal of the feedback controller.

18. A constant on-time voltage regulator, the constant on-time voltage regulator comprises:
    a power stage configured to convert an input direct current (DC) voltage into an output DC voltage;
    a driver device configured to drive the power stage;
    a timer configured to generate a constant on-time for the drive device;
    a ripple generation device configured to generate a ripple signal, wherein the ripple generation device comprising:
        a ripple generator configured to generate the ripple signal;
        a detector operably connected to the ripple generator and configured to detect a difference between an amplitude of the ripple signal and at least one reference amplitude; and
        a feedback controller operably connected to the ripple generator and the detector and configured to generate a control signal for controlling the amplitude of the ripple signal based on the detected difference; and
    a comparator configured to perform voltage comparison in response to the ripple signal to generate an output to the timer.

19. The constant on-time voltage regulator of claim 18, wherein the ripple generator comprises at least one of an adjustable current source, an adjustable capacitor and an adjustable amplifier, and wherein the feedback controller is further configured to control at least one of a current value of the adjustable current source, a capacitance of the adjustable capacitor and a gain of the adjustable amplifier based on the detected difference.

20. A method for ripple generation for a constant on-time voltage regulator, the method comprising:

generating a ripple signal;

detecting a difference between an amplitude of the ripple signal and a first reference amplitude and a second reference amplitude; and generating a control signal for controlling the amplitude of the ripple signal based on the detected difference;

wherein if the amplitude of the ripple signal is above the first reference amplitude, the control signal decreases the amplitude of the ripple signal, and if the amplitude of the ripple signal is below the second reference amplitude, the control signal increases the amplitude of the ripple signal.

* * * * *